(12) United States Patent
Pramanik et al.

(10) Patent No.: US 12,556,143 B2
(45) Date of Patent: Feb. 17, 2026

(54) AMPLIFIER CIRCUIT FOR BUFFERING HIGH SLEW RATE SIGNAL

(71) Applicant: Cirrus Logic International Semiconductor Ltd., Edinburgh (GB)

(72) Inventors: Neel Pramanik, Austin, TX (US); Prashanth Drakshapalli, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 572 days.

(21) Appl. No.: 18/098,264

(22) Filed: Jan. 18, 2023

(65) Prior Publication Data

US 2024/0243701 A1 Jul. 18, 2024

(51) Int. Cl.
*H03F 1/36* (2006.01)
*H03F 1/12* (2006.01)

(52) U.S. Cl.
CPC ......... *H03F 1/12* (2013.01); *H03F 2200/153* (2013.01)

(58) Field of Classification Search
CPC .. H03F 1/12; H03F 2200/153; H03F 2200/03; H03F 2200/408; H03F 1/14; H03F 3/187; H03F 3/45475

USPC ...................................................... 330/9, 292
See application file for complete search history.

(56) References Cited

U.S. PATENT DOCUMENTS 7,161,420 B1 * 1/2007 Aram .................. H03F 3/45475
330/84

* cited by examiner

*Primary Examiner* — Andrea Lindgren Baltzell
*Assistant Examiner* — Khiem D Nguyen
(74) *Attorney, Agent, or Firm* — Jackson Walker L.L.P.

(57) ABSTRACT

An amplifier circuit may include a first gain stage configured to receive an input signal at the first gain stage input and apply a first gain to the input signal to generate a first gain stage output signal at the first gain stage output, a second gain stage configured to receive the first gain stage output signal at the second gain stage input and apply a second gain to the first gain stage output signal to generate a second gain stage output signal at the second gain stage output, a feedforward gain stage configured to receive the input signal at the feedforward gain stage input and apply a feedforward gain to the input signal to generate a feedforward gain stage output signal at the feedforward gain stage output, and a compensation network coupled between the first gain stage output and the feedforward gain stage output.

21 Claims, 3 Drawing Sheets

AMPLIFIER CIRCUIT FOR BUFFERING HIGH SLEW RATE SIGNAL

FIELD OF DISCLOSURE

The present disclosure relates in general to circuits for audio devices, including without limitation personal audio devices such as wireless telephones and media players, and more specifically, to an amplifier circuit adapted for buffering a high slew rate signal.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Further, such personal audio devices may include other transducers, such as a linear resonant actuator or other haptic actuator that may be driven from an amplifier.

Oftentimes, an amplifier may be used as a signal buffer that applies a unity gain but conditions the signal for driving a particular type of output. It is often desirable to minimize power consumption, signal error, and signal delay in such buffering circuits, which is often a challenge when designing buffers that may be used in signal paths having a high swing and/or a high slew rate. Existing approaches for buffering high slew rate input signals include using buffers that employ Miller compensation, dominant pole compensation, and pole-zero compensation, but all of these approaches may require a high level of power consumption to satisfy slew rate requirements and such approaches may also impose significant signal error and delay.

SUMMARY

In accordance with the teachings of the present disclosure, one or more disadvantages and problems associated with existing approaches buffering high-slew rate signals may be reduced or eliminated.

In accordance with embodiments of the present disclosure, an amplifier circuit may include a first gain stage having a first gain stage input and a first gain stage output and configured to receive an input signal at the first gain stage input and apply a first gain to the input signal to generate a first gain stage output signal at the first gain stage output, a second gain stage having a second gain stage input and a second gain stage output and configured to receive the first gain stage output signal at the second gain stage input and apply a second gain to the first gain stage output signal to generate a second gain stage output signal at the second gain stage output, a feedforward gain stage having a feedforward gain stage input and a feedforward gain stage output and configured to receive the input signal at the feedforward gain stage input and apply a feedforward gain to the input signal to generate a feedforward gain stage output signal at the feedforward gain stage output, and a compensation network coupled between the first gain stage output and the feedforward gain stage output.

In accordance with these and other embodiments of the present disclosure, a method may include applying, with a first gain stage having a first gain stage input and a first gain stage output and configured to receive an input signal at the first gain stage input, a first gain to the input signal to generate a first gain stage output signal at the first gain stage output. The method may also include applying, with a second gain stage having a second gain stage input and a second gain stage output and configured to receive the first gain stage output signal at the second gain stage input, a second gain to the first gain stage output signal to generate a second gain stage output signal at the second gain stage output. The method may additionally include applying, with a feedforward gain stage having a feedforward gain stage input and a feedforward gain stage output and configured to receive the input signal at the feedforward gain stage input, a feedforward gain to the input signal to generate a feedforward gain stage output signal at the feedforward gain stage output. The method may further include compensating for frequency in a circuit comprising the first gain stage, second gain stage, and feedforward gain stage with a compensation network coupled between the first gain stage output and the feedforward gain stage output.

In accordance with these and other embodiments of the present disclosure, a system may include a load and an amplifier circuit configured to drive the load. The amplifier circuit may include a first gain stage having a first gain stage input and a first gain stage output and configured to receive an input signal at the first gain stage input and apply a first gain to the input signal to generate a first gain stage output signal at the first gain stage output, a second gain stage having a second gain stage input and a second gain stage output and configured to receive the first gain stage output signal at the second gain stage input and apply a second gain to the first gain stage output signal to generate a second gain stage output signal at the second gain stage output, a feedforward gain stage having a feedforward gain stage input and a feedforward gain stage output and configured to receive the input signal at the feedforward gain stage input and apply a feedforward gain to the input signal to generate a feedforward gain stage output signal at the feedforward gain stage output, and a compensation network coupled between the first gain stage output and the feedforward gain stage output.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The analog path portion may include an amplifier circuit to receive an analog signal generated from the digital path portion and apply a gain to the analog signal (e.g., a unity gain to buffer the analog signal) to generate an output signal, wherein said output signal may be communicated to a loudspeaker or other transducer for playback and/or to other circuitry for processing.

Figure 1:
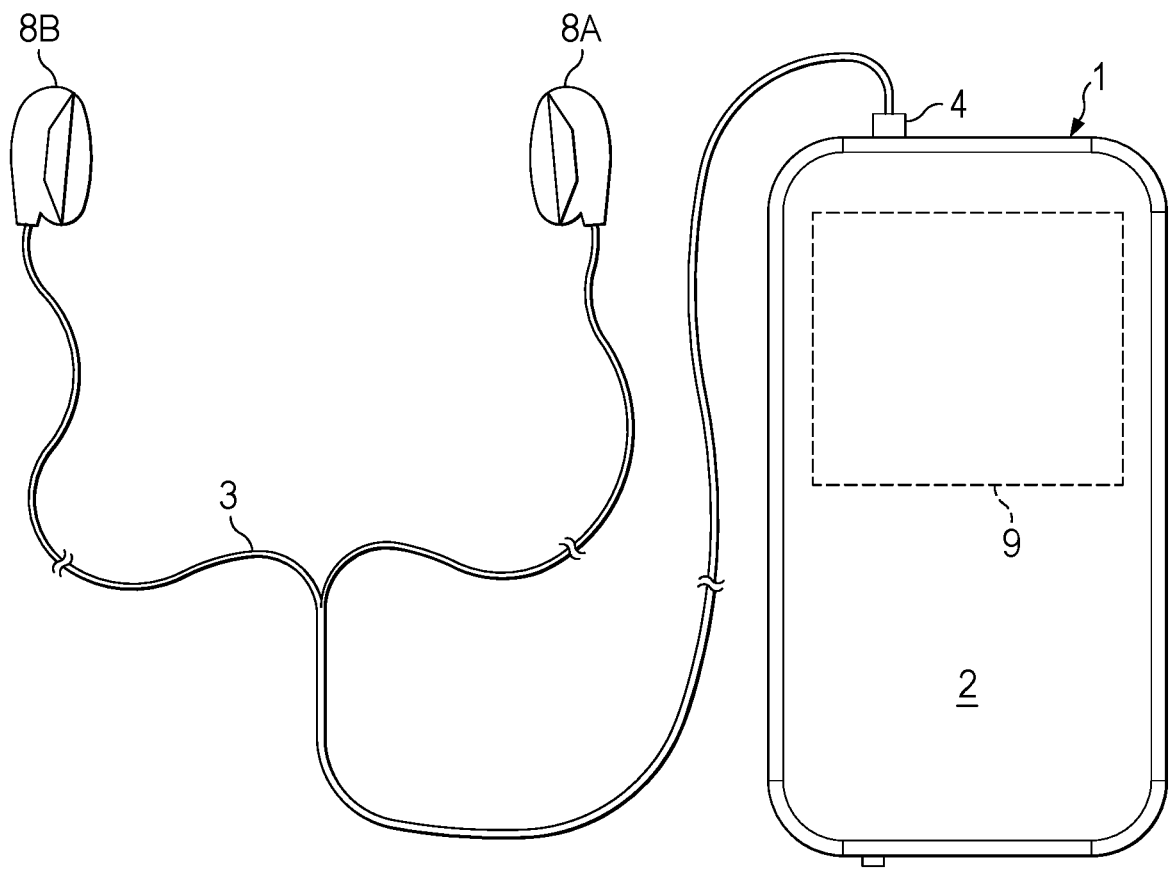
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, and/or another audio transducer.

Figure 2:
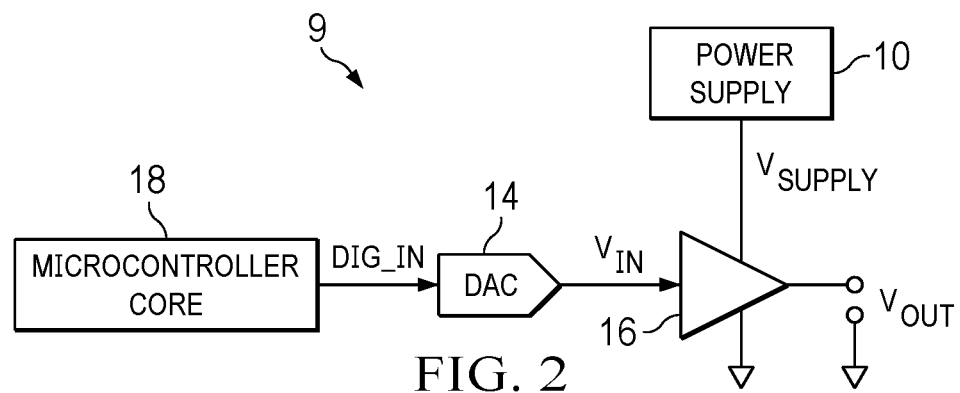
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may be referred to herein as a digital path portion of the signal path from the input node for digital audio input signal DIG_IN to the output node for output voltage signal $V_{OUT}$ depicted in FIG. 2.

DAC 14 may supply analog signal $V_{IN}$ to an amplifier stage 16 which may amplify or attenuate audio input signal $V_{IN}$ in conformity with a gain to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIG. 2. In the relevant art, amplifier stage 16 may sometimes be referred to as an audio expander. In some embodiments, amplifier stage 16 may comprise a buffer that applies a unity gain to analog signal $V_{IN}$ to generate audio output signal $V_{OUT}$. In some embodiments, amplifier stage 16 may comprise a multi-stage amplifier circuit, such as amplifier circuit 30 depicted in FIG. 3 and described below. A power supply 10 may provide the power supply rail inputs of amplifier stage 16.

Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, including without limitation an automobile, a building, or other structure. Further, an amplifier stage such as amplifier stage 16 may be used in other applications besides audio processing and generating audio signals, including without limitation generating analog signals for other transducers, including without limitation haptic transducers.

Figure 3:
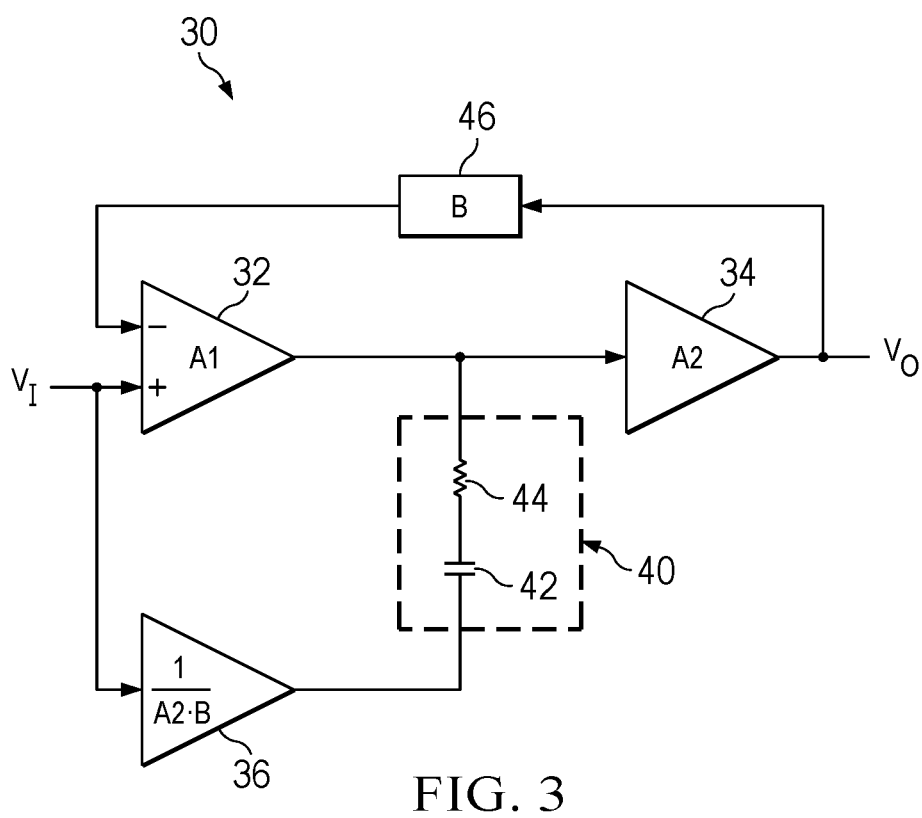
FIG. 3 is a block diagram of selected components of an amplifier circuit, in accordance with embodiments of the present disclosure.

FIG. 3 is a block diagram of selected components of an amplifier circuit 30, in accordance with embodiments of the present disclosure. In some embodiments, amplifier circuit 30 may be used as or as part of amplifier stage 16 of audio IC 9. However, amplifier circuit 30 may be used in any other suitable application beyond that of audio circuits.

As shown in FIG. 3, amplifier circuit 30 may include a first gain stage 32, a second gain stage 34, a feedforward gain stage 36, a compensation network 40, and a feedback network having a gain B. First gain stage 32 may have a first gain stage input and a first gain stage output and may be configured to receive an input signal $V_I$ at the first gain stage input and apply a first gain A1 to input signal $V_I$ to generate a first gain stage output signal at the first gain stage output. When amplifier circuit 30 is used as or as part of amplifier stage 16 of FIG. 2, input signal $V_I$ may be analog signal $V_{IN}$ or another signal generated in response to analog signal $V_{IN}$. In some embodiments, first gain stage 32 may be implemented as an operational amplifier. In these and other embodiments, first gain A1 may comprise a non-inverting gain.

Second gain stage 34 may have a second gain stage input and a second gain stage output and may be configured to receive the first gain stage output signal at the second gain stage input and apply a second gain A2 to the first gain stage output signal to generate a second gain stage output signal $V_O$ at the second gain stage output. When amplifier circuit 30 is used as or as part of amplifier stage 16 of FIG. 2, audio output signal $V_{OUT}$ may be second gain stage output signal $V_O$ or another signal generated in response to second gain stage output signal $V_O$. As shown in FIG. 3, second gain stage output signal $V_O$ may be fed back to first gain stage 32 as a feedback input to first gain stage 32, thus creating a closed loop amplifier circuit. In some embodiments, second gain stage 34 may be implemented as an operational amplifier. In these and other embodiments, second gain A2 may comprise a non-inverting gain.

Feedforward gain stage 36 may have a feedforward gain stage input and a feedforward gain stage output and may be configured to receive an input signal $V_I$ at the feedforward gain stage input and apply a feedforward gain to input signal $V_I$ to generate a feedforward gain stage output signal at the feedforward gain stage output. In some embodiments, the feedforward gain of feedforward gain stage 36 may be proportional to the inverse of second gain A2 (e.g., the feedforward gain is proportional to 1/A2). In some embodiments, feedforward gain stage 36 may be implemented as an operational amplifier. Further, in embodiments in which feedback network 46 is present, the feedforward gain of feedforward gain stage 36 may be proportional to the inverse of a feedback gain B of feedback network 46, such that the feedforward gain is equal to 1/A2. B. In these and other embodiments, the feedforward gain (e.g., 1/A2·B) may comprise a non-inverting gain.

Feedback network 46 may comprise any suitable network of one or more passive and/or active circuit components configured to apply feedback gain B to second gain stage output signal $V_O$ and feedback such amplified/attenuated signal to a feedback input terminal of first gain stage 32.

In some embodiments, one or more of first gain A1, second gain A2, and feedback gain B may be tunable.

Compensation network 40 may be coupled between the first gain stage output and the feedforward gain stage output, and may comprise any suitable system, device, or apparatus configured to provide frequency compensation, particularly at high frequencies of input signal $V_I$, to ensure loop stability (e.g., reduce or eliminate oscillation) of the closed loop of amplifier circuit 30. As shown in FIG. 3, in some embodiments, compensation network 40 may be implemented as a capacitor 42 in series with a resistor 44. However, any other suitable compensation network may be used to implement compensation network 40, including a compensation network comprising any suitable combination of one or more passive circuit elements (e.g., resistors, capacitors, and/or inductors).

Figure 4:
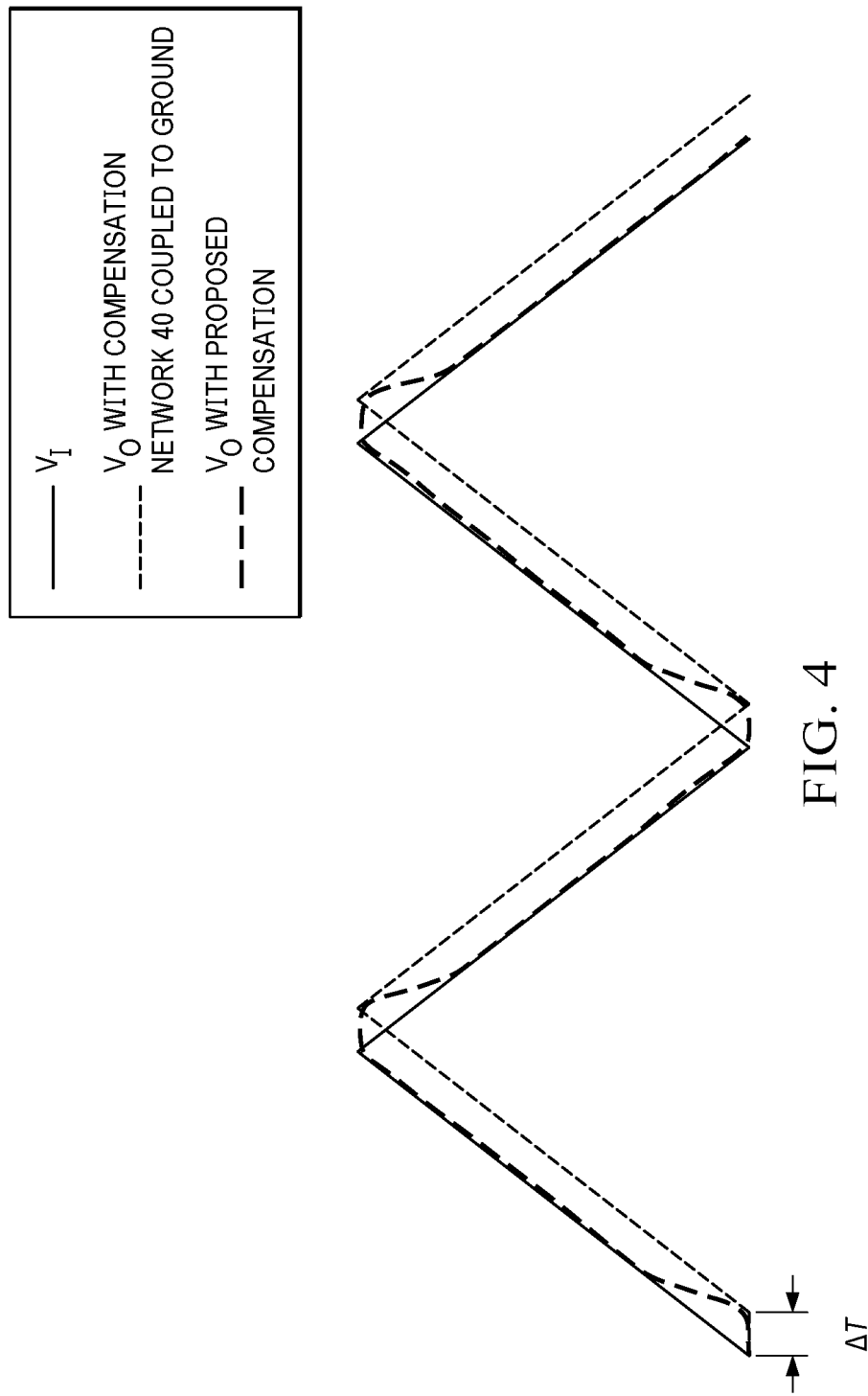
FIG. 4 is a graphical depiction of the compensation scheme depicted in FIG. 3, in accordance with embodiments of the present disclosure.

One disadvantage of compensation networks used in traditional approaches is that compensation networks dissipate significant power at higher frequencies, due to which first gain stage 32 may consume significant power in order to support high-frequency and high-slew-rate content. However, in the architecture of amplifier circuit 30 of FIG. 3, feedforward gain stage 36 may mimic the high-frequency content at the output of first gain stage 32 onto the output of feedforward gain stage 36. As a result, a significant voltage difference may appear across compensation network 40 only momentarily when input signal $V_I$ changes direction. However, during steady state ramping of input signal $V_I$, due to feedforward gain stage 36 replicating the output of first gain stage 32 onto both terminals of compensation network 40, the voltage and/or change in voltage across compensation network 40 (e.g., the instantaneous change in voltage across capacitor 42) may be approximately zero, as shown in FIG. 4. Consequently, during such steady-state condition, compensation network 40 may require approximately zero current from first gain stage 32, thus minimizing power and/or steady-state error in the signal path. Further, without a significant current demand being imposed by compensation network 40, the device size and/or bias current of first gain stage 32 required to support current demand of compensation circuitry and bandwidth requirements of amplifier circuit 30 may be smaller than that of traditional approaches, thus minimizing circuit area and/or power consumption.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An amplifier circuit comprising:
a first gain stage having a first gain stage input and a first gain stage output and configured to receive an input signal at the first gain stage input and apply a first gain to the input signal to generate a first gain stage output signal at the first gain stage output;
a second gain stage having a second gain stage input and a second gain stage output and configured to receive the first gain stage output signal at the second gain stage input and apply a second gain to the first gain stage output signal to generate a second gain stage output signal at the second gain stage output;
a feedforward gain stage having a feedforward gain stage input and a feedforward gain stage output and configured to receive the input signal at the feedforward gain stage input and apply a feedforward gain to the input signal to generate a feedforward gain stage output signal at the feedforward gain stage output, wherein the feedforward gain is inversely proportional to the second gain; and a compensation network coupled between the first gain stage output and the feedforward gain stage output.

2. An amplifier circuit comprising:

a first gain stage having a first gain stage input and a first gain stage output and configured to receive an input signal at the first gain stage input and apply a first gain to the input signal to generate a first gain stage output signal at the first gain stage output;

a second gain stage having a second gain stage input and a second gain stage output and configured to receive the first gain stage output signal at the second gain stage input and apply a second gain to the first gain stage output signal to generate a second gain stage output signal at the second gain stage output;

a feedforward gain stage having a feedforward gain stage input and a feedforward gain stage output and configured to receive the input signal at the feedforward gain stage input and apply a feedforward gain to the input signal to generate a feedforward gain stage output signal at the feedforward gain stage output;

a compensation network coupled between the first gain stage output and the feedforward gain stage output; and a feedback network having a feedback gain and coupled between the second gain stage output and a feedback input of the first gain stage.

3. The amplifier circuit of claim 2, wherein the feedforward gain is inversely proportional to the second gain and inversely proportional to the feedback gain.

4. The amplifier circuit of claim 2, wherein the compensation network comprises one or more passive circuitry elements.

5. The amplifier circuit of claim 2, wherein the compensation network comprises a capacitor in series with a resistor.

6. A method comprising:

applying, with a first gain stage having a first gain stage input and a first gain stage output and configured to receive an input signal at the first gain stage input, a first gain to the input signal to generate a first gain stage output signal at the first gain stage output;

applying, with a second gain stage having a second gain stage input and a second gain stage output and configured to receive the first gain stage output signal at the second gain stage input, a second gain to the first gain stage output signal to generate a second gain stage output signal at the second gain stage output;

applying, with a feedforward gain stage having a feedforward gain stage input and a feedforward gain stage output and configured to receive the input signal at the feedforward gain stage input, a feedforward gain to the input signal to generate a feedforward gain stage output signal at the feedforward gain stage output, wherein the feedforward gain is inversely proportional to the second gain; and compensating for frequency in a circuit comprising the first gain stage, second gain stage, and feedforward gain stage with a compensation network coupled between the first gain stage output and the feedforward gain stage output.

7. A method comprising:

applying, with a first gain stage having a first gain stage input and a first gain stage output and configured to receive an input signal at the first gain stage input, a first gain to the input signal to generate a first gain stage output signal at the first gain stage output;

applying, with a second gain stage having a second gain stage input and a second gain stage output and configured to receive the first gain stage output signal at the second gain stage input, a second gain to the first gain stage output signal to generate a second gain stage output signal at the second gain stage output;

applying, with a feedforward gain stage having a feedforward gain stage input and a feedforward gain stage output and configured to receive the input signal at the feedforward gain stage input, a feedforward gain to the input signal to generate a feedforward gain stage output signal at the feedforward gain stage output;

compensating for frequency in a circuit comprising the first gain stage, second gain stage, and feedforward gain stage with a compensation network coupled between the first gain stage output and the feedforward gain stage output; and applying a feedback gain with a feedback network coupled between the second gain stage output and a feedback input of the first gain stage.

8. The method of claim 7, wherein the feedforward gain is inversely proportional to the second gain and inversely proportional to the feedback gain.

9. The method of claim 7, wherein the compensation network comprises one or more passive circuitry elements.

10. The method of claim 7, wherein the compensation network comprises a capacitor in series with a resistor.

11. A system comprising:

a load; and an amplifier circuit configured to drive the load, wherein the amplifier circuit comprises:

a first gain stage having a first gain stage input and a first gain stage output and configured to receive an input signal at the first gain stage input and apply a first gain to the input signal to generate a first gain stage output signal at the first gain stage output;

a second gain stage having a second gain stage input and a second gain stage output and configured to receive the first gain stage output signal at the second gain stage input and apply a second gain to the first gain stage output signal to generate a second gain stage output signal at the second gain stage output;

a feedforward gain stage having a feedforward gain stage input and a feedforward gain stage output and configured to receive the input signal at the feedforward gain stage input and apply a feedforward gain to the input signal to generate a feedforward gain stage output signal at the feedforward gain stage output, wherein the feedforward gain is inversely proportional to the second gain; and a compensation network coupled between the first gain stage output and the feedforward gain stage output.

12. A system comprising:

a load; and an amplifier circuit configured to drive the load, wherein the amplifier circuit comprises:

a first gain stage having a first gain stage input and a first gain stage output and configured to receive an input signal at the first gain stage input and apply a first gain to the input signal to generate a first gain stage output signal at the first gain stage output;

a second gain stage having a second gain stage input and a second gain stage output and configured to receive the first gain stage output signal at the second gain stage input and apply a second gain to the first gain stage output signal to generate a second gain stage output signal at the second gain stage output;

a feedforward gain stage having a feedforward gain stage input and a feedforward gain stage output and configured to receive the input signal at the feedforward gain stage input and apply a feedforward gain to the input signal to generate a feedforward gain stage output signal at the feedforward gain stage output;

a compensation network coupled between the first gain stage output and the feedforward gain stage output; and a feedback network having a feedback gain and coupled between the second gain stage output and a feedback input of the first gain stage.

13. The system of claim 12, wherein the feedforward gain is inversely proportional to the second gain and inversely proportional to the feedback gain.

14. The system of claim 12, wherein the compensation network comprises one or more passive circuitry elements.

15. The system of claim 12, wherein the compensation network comprises a capacitor in series with a resistor.

16. The amplifier circuit of claim 1, wherein the compensation network comprises one or more passive circuitry elements.

17. The amplifier circuit of claim 1, wherein the compensation network comprises a capacitor in series with a resistor.

18. The method of claim 6, wherein the compensation network comprises one or more passive circuitry elements.

19. The method of claim 6, wherein the compensation network comprises a capacitor in series with a resistor.

20. The system of claim 11, wherein the compensation network comprises one or more passive circuitry elements.

21. The system of claim 11, wherein the compensation network comprises a capacitor in series with a resistor.

* * * * *